United States Patent
Kinoshita et al.

(10) Patent No.: US 9,117,742 B2
(45) Date of Patent: Aug. 25, 2015

(54) HIGH ELECTRON MOBILITY TRANSISTOR WITH SHORTENED RECOVERY TIME

(71) Applicant: Mitsubishi Electric Corporation, Tokyo (JP)

(72) Inventors: Hiroyuki Kinoshita, Tokyo (JP); Yoshitsugu Yamamoto, Tokyo (JP); Tetsuo Kunii, Tokyo (JP)

(73) Assignee: MITSUBISHI ELECTRIC CORPORATION, Tokyo (KE)

( * ) Notice: Subject to any disclaimer, the term of this patent is extended or adjusted under 35 U.S.C. 154(b) by 0 days.

(21) Appl. No.: 14/174,928

(22) Filed: Feb. 7, 2014

(65) Prior Publication Data

US 2014/0353674 A1    Dec. 4, 2014

(30) Foreign Application Priority Data

May 29, 2013    (JP) .................. 2013-113163

(51) Int. Cl.
*H01L 31/0328*    (2006.01)
*H01L 29/20*    (2006.01)
(Continued)

(52) U.S. Cl.
CPC ...... *H01L 29/2003* (2013.01); *H01L 29/66462* (2013.01); *H01L 29/772* (2013.01); *H01L 29/778* (2013.01); *H01L 29/7783* (2013.01); *H01L 29/7787* (2013.01)

(58) Field of Classification Search
CPC . H01L 29/772; H01L 29/778; H01L 29/7783; H01L 29/7787
USPC ................ 257/183, 190, 192, 194, E29.246
See application file for complete search history.

(56) References Cited

U.S. PATENT DOCUMENTS

2001/0015446 A1    8/2001    Inoue et al.
2006/0102926 A1*   5/2006    Kikkawa et al. .............. 257/103
(Continued)

FOREIGN PATENT DOCUMENTS

JP    2001-230407 A    8/2001
JP    2009-59945 A    3/2009
(Continued)

OTHER PUBLICATIONS

K. Takagi; "Current Status of X-Band and Ku-Band High Power GaN HEMTs", *IEICE Transactions on Electronics (Japanese Edition)*, vol. J92-C, No. 12, pp. 762-769, (2009).

(Continued)

*Primary Examiner* — Matthew E Warren
(74) *Attorney, Agent, or Firm* — Leydig, Voit & Mayer, Ltd.

(57) ABSTRACT

A semiconductor device includes a substrate, a buffer layer of GaN containing at least one of Fe and C and disposed on the substrate, a channel layer of GaN disposed on the buffer layer and through which electrons travel, an electron supply layer disposed on the channel layer and producing a two-dimensional electron gas in the channel layer, a gate electrode, a drain electrode, and a source electrode. Recovery time of a drain current of the semiconductor device is no more than 5 seconds, where the recovery time is defined as the period of time after the semiconductor device is stopped from outputting high frequency power until the change in the drain current, after the stopping of the semiconductor device, reaches 95% of the change in the drain current occurring during the first 10 seconds after the stopping of the semiconductor device.

5 Claims, 5 Drawing Sheets

(51) Int. Cl.
*H01L 29/778* (2006.01)
*H01L 29/772* (2006.01)
*H01L 29/66* (2006.01)

(56) References Cited

U.S. PATENT DOCUMENTS

2008/0237610 A1* 10/2008 Imanishi et al. ............... 257/77
2009/0058532 A1    3/2009 Kikkawa et al.
2013/0341641 A1* 12/2013 Nishiwaki et al. ............. 257/77

FOREIGN PATENT DOCUMENTS

| JP | 2010-199597 A | 9/2010 |
| JP | 2011-165777 A | 8/2011 |
| JP | 2012-174697 A | 9/2012 |

OTHER PUBLICATIONS

Kikkawa et al.; "High Efficiency GaN-HEMT Amplifier for Mobile WiMAX Base Station", *Fujitsu*, vol. 60, No. 1, pp. 46-60, (2009).

* cited by examiner

HIGH ELECTRON MOBILITY TRANSISTOR WITH SHORTENED RECOVERY TIME

BACKGROUND OF THE INVENTION

1. Field of the Invention

The present invention relates to a semiconductor device used, e.g., for amplifying signals.

2. Background Art

Semiconductor devices such as high electron mobility transistors (HEMTs) have a channel layer in which two-dimensional electron gas is formed. Japanese Laid-Open Patent Publication No. 2010-199597 discloses a semiconductor device in which a channel layer is formed on an SiC substrate, with a buffer layer interposed therebetween. This buffer layer has an Fe concentration of $1 \times 10^{18} - 1 \times 10^{20}/cm^3$.

The Fe in the buffer layer serves to deactivate donor impurities in the buffer layer and thereby reduce the carrier concentration of the layer. This reduces the recovery time (or reverse recovery time).

Typical conventional semiconductor devices are configured such that their drain current changes considerably during the first approximately 10 seconds after they have been stopped from outputting high frequency power. Such semiconductor devices are disadvantages in that, when they are used as amplifiers, they exhibit relatively poor linearity and their gain varies considerably with time, resulting in unstable output power.

SUMMARY OF THE INVENTION

The present invention has been made to solve the above problems. It is, therefore, an object of the present invention to provide a semiconductor device configured such that, when used as an amplifier, the semiconductor device exhibits relatively high linearity and a gain which does not substantially vary with time, thereby producing stable power.

The features and advantages of the present invention may be summarized as follows.

According to one aspect of the present invention, a semiconductor device includes a substrate, a buffer layer of GaN containing Fe or C and formed on the substrate, a channel layer of GaN formed on the buffer layer and through which electrons travel, an electron supply layer formed on the channel layer and serving to form two-dimensional electron gas in the channel layer, a gate electrode formed on the electron supply layer, a drain electrode formed on the electron supply layer, and a source electrode formed on the electron supply layer. A recovery time of a drain current of the semiconductor device is 5 seconds or less, where the recovery time is defined as the period of time after the semiconductor device is stopped from outputting high frequency power until the amount of change in the drain current after the stopping of the semiconductor device reaches 95% of the amount of change in the drain current occurring during the first 10 seconds after the stopping of the semiconductor device.

Other and further objects, features and advantages of the invention will appear more fully from the following description.

DETAILED DESCRIPTION OF THE PREFERRED EMBODIMENT

A semiconductor device in accordance with an embodiment of the present invention will be described with reference to the accompanying drawings. Throughout the specification the same or corresponding components are designated by the same reference symbols and may be described only once.

Embodiment

Figure 1:
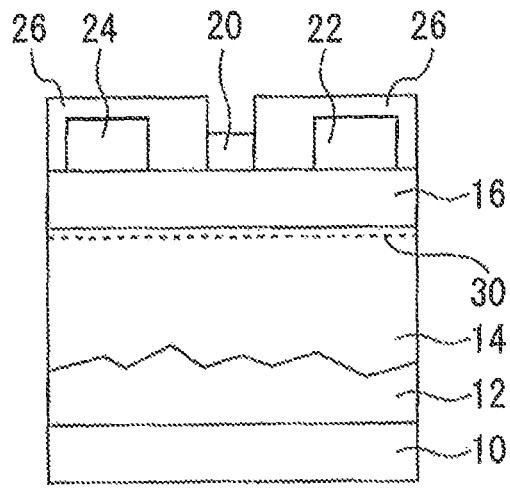
FIG. 1 is a cross-sectional view of a semiconductor device in accordance with an embodiment of the present invention.

FIG. 1 is a cross-sectional view of a semiconductor device in accordance with an embodiment of the present invention. This semiconductor device includes a substrate 10 formed of, e.g., sapphire, SiC, Si, or GaN. A buffer layer 12 is formed on the substrate 10. The buffer layer 12 is formed of GaN doped with a transition metal element (namely, Fe or C). The Fe or C concentration doped in the buffer layer 12 is in the range of from $1 \times 10^{16}$ cm$^{-3}$ to $1 \times 10^{18}$ cm$^{-3}$. The buffer layer 12 has a thickness of, e.g., 1-1.5 μm.

The buffer layer 12 has a deep p-type energy level due to the presence of, e.g., Fe, and carriers formed in this energy level serve to cancel the effect of n-type carriers. As a result, the buffer layer 12 is of the p-conductivity type. It should be noted that an n-type energy level, in which n-type carriers are generated, is formed due to the presence of Si impurities or unintended defects.

A channel layer 14 of GaN is formed on the buffer layer 12. The channel layer 14 has a thickness of, e.g., 0.5-2 μm. The channel layer 14 functions as an electron traveling layer through which electrons travel. It should be noted that the channel layer 14 contains neither Fe nor C.

An electron supply layer 16 for forming two-dimensional electron gas in the channel layer 14 is formed on the channel layer 14. The electron supply layer 16 is formed of, e.g., AlGaN. The electron supply layer 16 has a thickness of, e.g., 20-30 nm. A gate electrode 20, a drain electrode 22, and a source electrode 24 are formed on the electron supply layer 16. The gate electrode 20, the drain electrode 22, and the source electrode 24 are insulated from each other by an insulating film 26.

The semiconductor device shown in FIG. 1 is a high electron mobility transistor of GaN (GaN-HEMT). The basic operation of this semiconductor device is the same as that of known GaN-HEMTs. That is, when the semiconductor device is turned on, two-dimensional electron gas 30 (indicated by a dashed line in FIG. 1) is generated in the portion of the channel layer 14 adjacent the electron supply layer 16. It should be noted that the device isolation region and the wiring in the semiconductor device are omitted from FIG. 1.

Figure 2:
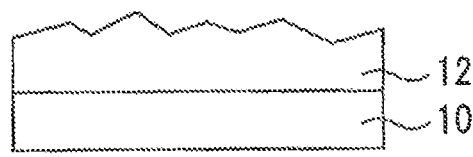
FIG. 2 shows buffer layer.

A method of manufacturing a semiconductor device in accordance with the first embodiment will be described. This method begins by forming a buffer layer 12 on a substrate 10, as shown in FIG. 2. Specifically, first, an AlN nucleation layer is grown on the substrate 10 to a thickness of 50 nm by metal organic chemical vapor deposition (MOCVD). The buffer layer 12 is then formed to a thickness of, e.g., 1-1.5 μm. The buffer layer 12 is formed to have an Fe or C doping concentration in the range of from $1\times10^{16}$ cm$^{-3}$ to $1\times10^{18}$ cm$^{-3}$.

Figure 3:
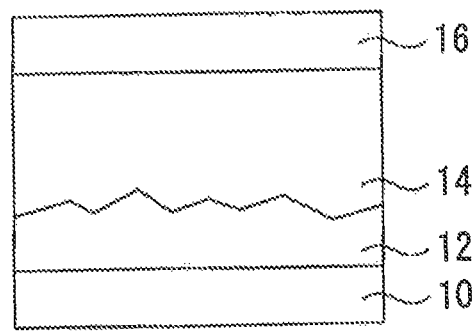
FIG. 3 shows channel layer and electron supply layer.

Next, as shown in FIG. 3, a channel layer 14 and an electron supply layer 16 are formed on the buffer layer 12. Like the buffer layer 12, the channel layer 14 and the electron supply layer 16 are formed by MOCVD. The MOCVD process for growing each layer uses trimethyl aluminum gas, trimethyl gallium gas, and/or ammonia gas as material gasses. Specifically, in addition to ammonia gas, either trimethyl aluminum gas (serving as an Al source) or trimethyl gallium gas (serving as a Ga source) or both are supplied depending on the layer to be grown. Further, the flow rate of each gas is also adjusted according to the layer to be grown. The flow rate of ammonia gas is set at 1-10 LM (liter/minute). It should be noted that, when growing the buffer layer 12, an organometallic material containing iron, such as ferrocene, is supplied in addition to other material gas at a growth pressure of 100 Torr or less and a growth temperature of 900-1050° C. In this way the buffer layer 12 may be formed to have an Fe concentration of, e.g., $5\times10^{19}$ cm$^{-3}$.

Figure 4:
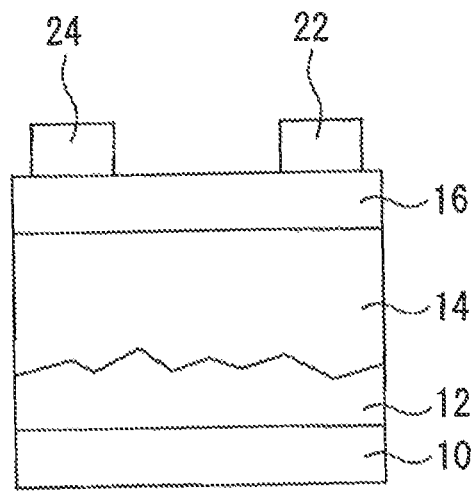
FIG. 4 shows drain electrode and a source electrode.

Next, a drain electrode 22 and a source electrode 24 are formed, as shown in FIG. 4. Specifically, the drain electrode 22 and the source electrode 24 are formed on predetermined areas of the surface of the electron supply layer 16 by means of a lift-off technique. The drain electrode 22 and the source electrode 24 are formed of, e.g., a Ti/Al film.

Figure 5:
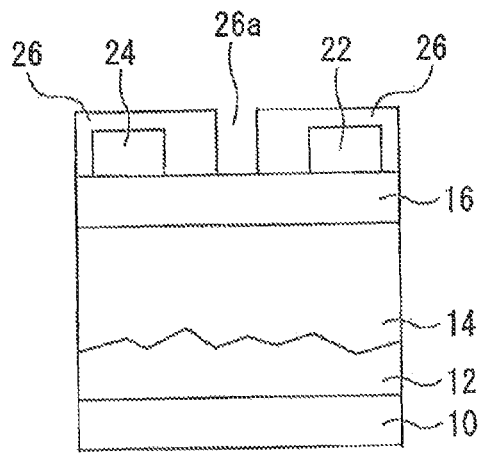
FIG. 5 shows insulating film.

An insulating film 26 is then formed, as shown in FIG. 5. Specifically, first, an SiN film is deposited on the entire surface of the partially completed device by plasma CVD. An opening 26a reaching the electron supply layer 16 is then formed in the SiN film by photolithography and dry etching.

Next, as shown in FIG. 1, a gate electrode 20 is formed on the surface of the electron supply layer 16 exposed by the opening 26a shown in FIG. 5. The gate electrode 20 is formed of, e.g., an Ni/Au film and produced by means of a lift-off technique. This completes the manufacture of the GaN-HEMT (semiconductor device) shown in FIG. 1.

Figure 6:
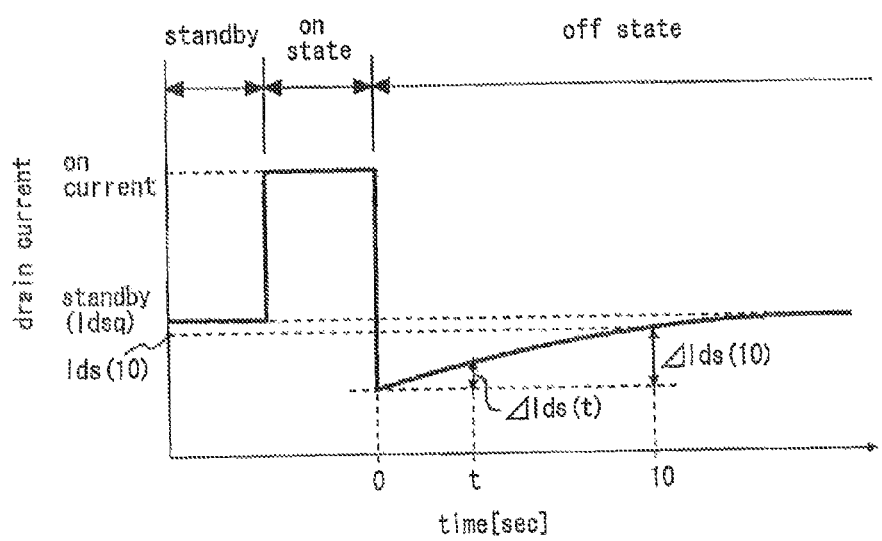
FIG. 6 shows a typical example of a transition in the drain current of a known GaN-HEMT.

FIG. 6 is a graph showing a typical example of a transition in the drain current of a known GaN-HEMT when the GaN-HEMT is switched from its on state (in which it outputs high frequency power, or RF power) to its off state. When the GaN-HEMT is stopped from outputting high frequency power, that is, when the GaN-HEMT is switched from its on state to its off state, the drain current immediately drops to its minimum value and then gradually increases. That is, a certain length of time is required for the drain current to become equal to the standby drain current (Idsq) of the GaN-HEMT. This is referred to as a recovery phenomenon (of a drain current). This recovery phenomenon is due to the fact that it takes time for traps in the buffer layer to capture and release carriers. The traps assume various charge states (namely, positive, negative, and neutral charge states) by capturing or releasing electrons or holes. It should be noted that the output gain of a semiconductor device also exhibits a recovery phenomenon similar to that of the drain current.

Let $\Delta Ids(t)$ represent the amount of change in the drain current during the first t seconds after the semiconductor device has been stopped from outputting high frequency power (that is, after the semiconductor device has been switched from its on state to its off state), and $\Delta Ids(10)$ represent the amount of change in the drain current during the first 10 seconds after the semiconductor device has been stopped from outputting high frequency power. Further, the recovery time of the drain current is defined herein as the value of t when $\Delta Ids(t)$ is 95% of $\Delta Ids(10)$. It has been found that when a semiconductor device with a long recovery time is used as an amplifier, it exhibits poor linearity and a gain which varies considerably with time resulting in unstable output power.

The semiconductor device of the present embodiment has a relatively short recovery time, since the buffer layer 12 contains Fe or C. Specifically, the Fe or C contained in the buffer layer 12 neutralizes the charge generated by impurities that have contaminated the buffer layer 12 during its growth, as well as the charge generated by defects in the buffer layer 12. Further, the deep energy level formed due to the presence of the Fe or C in the buffer layer 12 recaptures and re-releases carriers that have been injected into the buffer layer 12, and carriers that have been released from the buffer layer 12, thereby stabilizing the Fermi level. This reduces the recovery time. The recovery time is preferably no more than 5 seconds, more preferably no more than 0.5 seconds, and most preferably zero. Thus, the recovery time of a semiconductor device may be reduced to improve its linearity and to reduce the change in its gain with time and thereby stabilize its output power when the semiconductor device is used as an amplifier.

Figure 7:
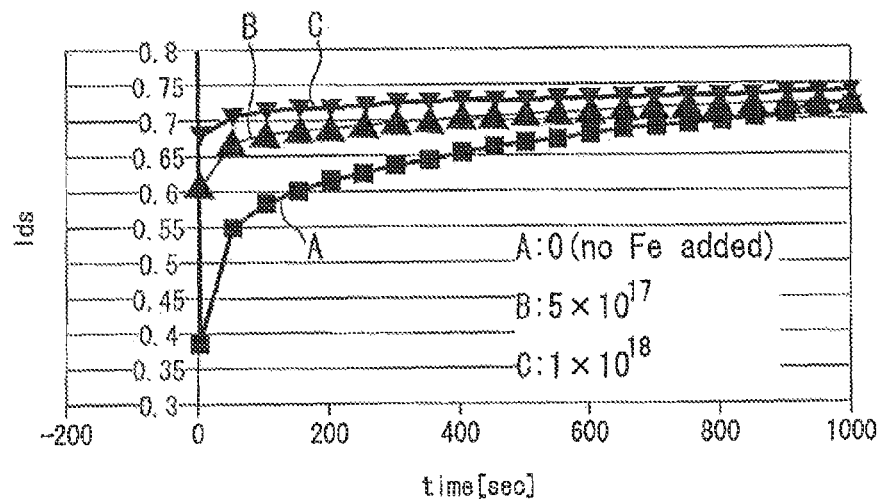
FIG. 7 shows three curves A, B, and C each illustrating the change in the drain current of a different semiconductor device.

FIG. 7 is a graph of three curves A, B, and C each illustrating the change in the drain current of a different semiconductor device with time after the semiconductor device has been stopped from outputting high frequency power (that is, after the semiconductor device has been switched from its on state to its off state), wherein each semiconductor device is of the type of the present embodiment and has a similar configuration, but has a different buffer layer. Specifically, curve A represents a semiconductor device whose buffer layer contains neither Fe nor C. Curve B represents a semiconductor device whose buffer layer has an Fe concentration of $5\times10^{17}$ cm$^{-3}$. Curve C represents a semiconductor device whose buffer layer has an Fe concentration of $1\times10^{18}$ cm$^{-3}$. As shown in FIG. 7, the greater the Fe concentration, the faster the drain current reaches the standby drain current level (Idsq).

Figure 8:
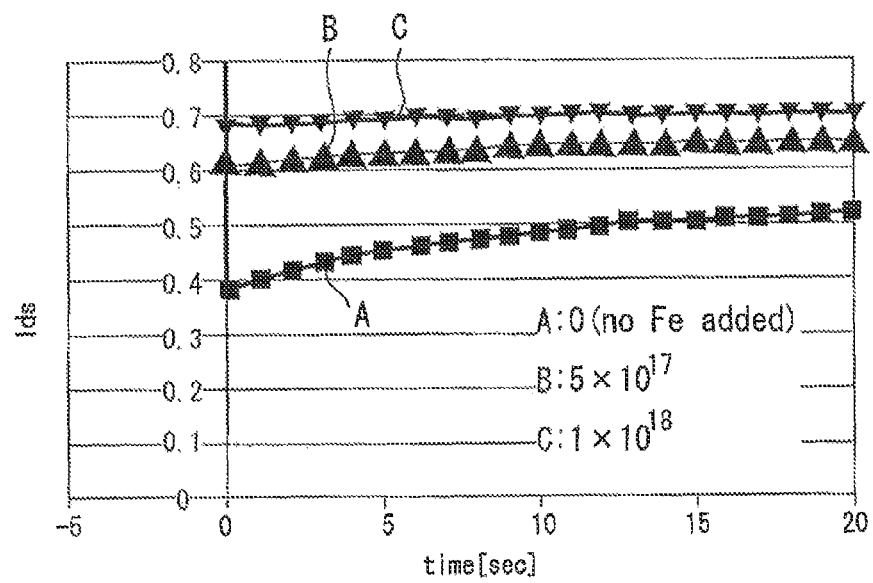
FIG. 8 is an enlargement of the first seconds of the graph of FIG. 7.

FIG. 8 is an enlargement of the first 20 seconds of the graph of FIG. 7. An important consideration in the design and selection of a GaN-HEMT is its operating characteristics during the first approximately 10 seconds after it has been stopped from outputting high frequency power. Curve A has a $\Delta Ids(10)$ of 98 mA, curve B has a $\Delta Ids(10)$ of 34.3 mA, and curve C has a $\Delta Ids(10)$ of 17.6 mA.

Let $\Delta Idsratio(10)$ represent the ratio of $\Delta Ids(10)$ to Ids(10). Curve A has a $\Delta Idsratio(10)$ of 20.3%, curve B has a $\Delta Idsratio(10)$ of 5.3%, and curve C has a $\Delta Idsratio(10)$ of 2.5%. Since the recovery time decreases with decreasing $\Delta Idsratio(10)$, the greater the Fe concentration, the shorter the recovery time.

Figure 9:
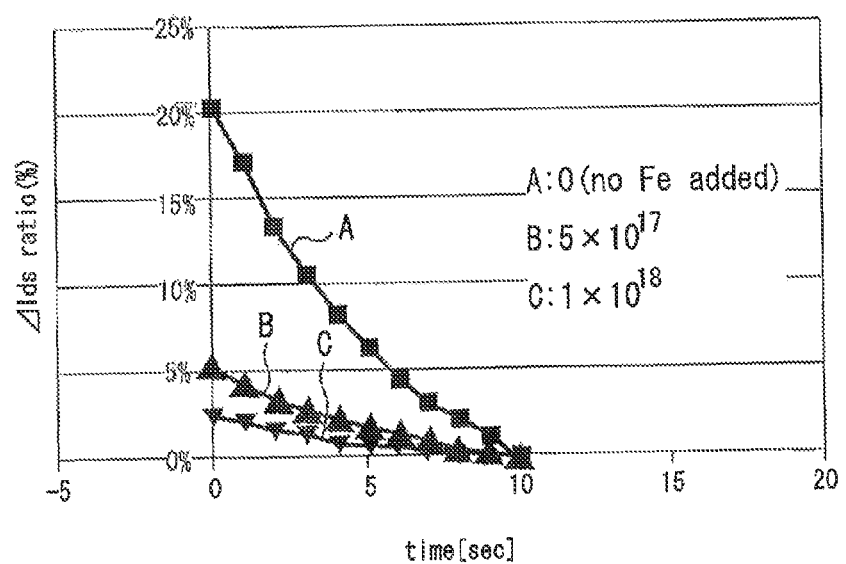
FIG. 9 a graph of the ratio of the difference between $\Delta Ids(t)$ and the $\Delta Ids(10)$ to the $Ids(10)$, where t is time.

FIG. 9 is a graph of the ratio of the difference between $\Delta Ids(t)$ and the $\Delta Ids(10)$ to the Ids(10), where t is time. As described above, the recovery time of the drain current is defined as the value of t when $\Delta Ids(t)$ is 95% of $\Delta Ids(10)$. In other words, the recovery time is the value of t when $\Delta Idsratio(t)$ is 5%. Therefore, in FIG. 9, the recovery time of curve A is 5.8 seconds, the recovery time of curve B is 0.38 seconds, and the recovery time of curve C is 0 seconds.

It should be noted that although the p-type carrier concentration (e.g., Fe concentration) of the buffer layer 12 must be higher than its n-type carrier concentration, if the p-type carrier concentration is too high, a decrease in the carrier mobility in the channel layer 14 will result. Therefore, the Fe or C concentration of the buffer layer 12 is preferably $1\times10^{18}$ cm$^{-3}$ or less; it may be below $1\times10^{18}$ cm$^{\times3}$. In order to reduce the recovery time, however, the Fe or C concentration of the buffer layer 12 is preferably no less than $1\times10^{16}$ cm$^{-3}$. Therefore, the Fe or C concentration of the buffer layer 12 may be no less than $1\times10^{16}$ cm$^{\times3}$ and no more than or below $1\times10^{18}$ cm$^{-3}$ in order to reduce the recovery time while minimizing reduction in the carrier mobility in the channel layer 14. It should be noted that the buffer layer 12 may contain both Fe and C. In that case, the combined concentration of Fe and C may be no less than $1\times10^{16}$ cm$^{-3}$ and no more than or below $1\times10^{18}$ cm$^{-3}$.

Since the thickness of the channel layer 14 is 0.5-2 μm, the two-dimensional electron gas 30 formed in the channel layer 14 is not affected by the Fe or C contained in the buffer layer 12. It should be noted that the thickness of the channel layer 14 may not be in the range of 0.5-2 μm, since the two-dimensional electron gas 30 in the channel layer 14 is not substantially affected by the Fe or C contained in the buffer layer 12 if the channel layer 14 has a thickness of no less than 0.5 μm.

The semiconductor device of the present embodiment may be used, e.g., as a single amplifier, or a transistor constituting an MMIC. A strain buffer layer may be interposed between the substrate 10 and the buffer layer 12 in order to enhance the crystalline quality of the channel layer 14 and confine electrons within the channel layer 14. The stain buffer layer may be formed of, e.g., AlN, AlGaN, GaN/InGaN, or AlN/AlGaN. The electron supply layer 16 may have a multilayer structure. An n$^+$ region may be formed under the source electrode 24 and/or the drain electrode 22 in order to reduce the contact resistance with the source and/or drain.

Thus the semiconductor device of the present invention is configured such that its drain current does not substantially change during the first approximately 10 seconds after the semiconductor device has been stopped from outputting high frequency power. As a result, when used as an amplifier, the semiconductor device exhibits relatively high linearity and a gain which does not substantially change with time, thereby producing stable power.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-113163, filed on May 29, 2013 including specification, claims, drawings and summary, on which the Convention priority of the present application is based, is incorporated herein by reference in its entirety.

What is claimed is:

1. A semiconductor device comprising:
   a substrate;
   a buffer layer of GaN containing Fe and C in a combined concentration within a range from $1\times10^{16}$ cm$^{-3}$ to $1\times10^{18}$ cm$^{-3}$, wherein said buffer layer is disposed on said substrate;
   a channel layer of GaN disposed on said buffer layer and through which electrons travel;
   an electron supply layer disposed on said channel layer and producing a two-dimensional electron gas in said channel layer;
   a gate electrode disposed on said electron supply layer;
   a drain electrode disposed on said electron supply layer; and
   a source electrode disposed on said electron supply layer, wherein
      recovery time of a drain current of said semiconductor device is no more than 5 seconds, and
      the recovery time is defined as the period of time after said semiconductor device is stopped from outputting high frequency power until the change in the drain current, after the stopping of said semiconductor device, reaches 95% of the change in the drain current occurring during the first 10 seconds after the stopping of said semiconductor device.

2. The semiconductor device according to claim 1, wherein the recovery time is no more than 0.5 seconds.

3. The semiconductor device according to claim 1, wherein the recovery time is zero.

4. The semiconductor device according to claim 1, wherein said channel layer has a thickness of no less than 0.5 μm, and said buffer layer has a thickness in a range from 1 to 1.5 μm.

5. The semiconductor device according to claim 1, wherein said buffer layer is p type.

* * * * *